US006876940B2

(12) United States Patent
Mittal

(10) Patent No.: US 6,876,940 B2
(45) Date of Patent: Apr. 5, 2005

(54) MEASURING CONSTRAINT PARAMETERS AT DIFFERENT COMBINATIONS OF CIRCUIT PARAMETERS

(75) Inventor: Sunand Mittal, Ghaziabad (IN)

(73) Assignee: Texas Instruments Incorporated, Dallas, TX (US)

( * ) Notice: Subject to any disclaimer, the term of this patent is extended or adjusted under 35 U.S.C. 154(b) by 88 days.

(21) Appl. No.: 10/620,602

(22) Filed: Jul. 17, 2003

(65) Prior Publication Data

US 2005/0015214 A1 Jan. 20, 2005

(51) Int. Cl.$^7$ .............................................. G06F 19/00
(52) U.S. Cl. ............................ 702/117; 716/6; 703/4
(58) Field of Search .............................. 702/117, 118, 702/119, 120, 125; 716/4, 5, 6; 703/13, 14, 15, 16, 17

(56) References Cited

U.S. PATENT DOCUMENTS

| | | | | |
|---|---|---|---|---|
| 5,508,937 | A | * | 4/1996 | Abato et al. ..................... 716/6 |
| 6,311,148 | B1 | * | 10/2001 | Krishnamoorthy ............ 703/19 |
| 6,584,598 | B2 | * | 6/2003 | Rao et al. ........................ 716/2 |
| 6,625,785 | B2 | * | 9/2003 | Chatterjee et al. .............. 716/4 |
| 2002/0072872 | A1 | * | 6/2002 | Chatterjee et al. ........... 702/117 |
| 2002/0143516 | A1 | * | 10/2002 | Rao et al. ....................... 703/19 |
| 2003/0093763 | A1 | * | 5/2003 | McConaghy .................... 716/2 |
| 2003/0121010 | A1 | * | 6/2003 | Aubury .......................... 716/4 |
| 2003/0177463 | A1 | * | 9/2003 | Daga ............................... 716/6 |
| 2003/0208343 | A1 | * | 11/2003 | Baez .............................. 703/2 |
| 2004/0002844 | A1 | * | 1/2004 | Jess et al. ...................... 703/14 |
| 2004/0044509 | A1 | * | 3/2004 | Demler et al. ................. 703/14 |
| 2004/0199888 | A1 | * | 10/2004 | Katla et al. ..................... 716/6 |
| 2004/0243953 | A1 | * | 12/2004 | Ramachandran et al. ...... 716/5 |
| 2004/0243964 | A1 | * | 12/2004 | McElvain et al. ............ 716/12 |

OTHER PUBLICATIONS

U.S. Appl. No. 10/403,080, filed Apr. 1, 2003, Katla et al.

* cited by examiner

*Primary Examiner*—Patrick Assouad
(74) *Attorney, Agent, or Firm*—Alan K. Stewart; W. James Brady, III; Frederick J. Telecky, Jr.

(57) ABSTRACT

The value of a constraint parameter for a given combination of circuit parameters is estimated based on any prior computed values for other combinations of circuit parameters. As the estimate may be close to the actual value of the constraint parameter, a search may be performed (e.g., using simulation) in a narrow search range around the estimated value. As a result, the constraint parameters at different combinations of circuit parameters may be measured quickly. According to another aspect of the present invention, a curve is generated based on the results of multiple search points (with at least one point generating a pass result and another one point generating a fail result), and searches may be conducted between the pass and fail points by first checking whether the delay corresponding to intermediate points on the curve is lower than a desired threshold value.

32 Claims, 7 Drawing Sheets

|  501  |  502  |  504  |  506  |  508  |  509  |
|-------|-------|-------|-------|-------|-------|
| (5,1) PCS | (5,2) PCS | (5,3) PDS | (5,4) PDS | (5,5) PDS | (5,6) PDS |
| (4,1) PCS | (4,2) PCS | (4,3) PDS | (4,4) PDS | (4,5) PDS | (4,6) PDS |
| (3,1) PCS | (3,2) PCS | (3,3) PDS | (3,4) PDS | (3,5) PDS | (3,6) PDS |
| (2,1) PLC | (2,2) PPC | (2,3) PDS | (2,4) PDS | (2,5) PDS | (2,6) PDS |
| (1,1) None | (1,2) PLC | (1,3) PDS | (1,4) PDS | (1,5) PDS | (1,6) PDS |

*FIG. 5*

MEASURING CONSTRAINT PARAMETERS AT DIFFERENT COMBINATIONS OF CIRCUIT PARAMETERS

RELATED APPLICATION

The present application is related to co-pending U.S. application entitled, "Reducing Time to Measure Constraint Parameters of Components in an Integrated Circuit", Ser. No. 10/403,080, filed on Apr. 1, 2003, naming as inventors: Katla et al, and assigned to common assignee.

BACKGROUND OF THE INVENTION

1. Field of the Invention

The present invention relates to computer aided design (CAD) used to implement integrated circuits, and more specifically to a method and apparatus for measuring constraint parameters at different combinations of circuit parameters.

2. Related Art

Integrated circuits generally contain several components such as flip-flops and registers. It is often desirable to determine several characteristics of the components, for example, to determine a maximum clock speed at which an integrated circuit may be operated. Some of such characteristics of interest are constraint parameters. Constraint parameters generally refer to values specifying the minimum delay/duration between occurrence of two signals, with the reference signal being termed as a constraining signal and the other signal being referred to as a constrained signal.

For example, constraint parameters of interest with reference to sequential components (having memory, e.g. flip-flops) include setup time, hold time and minimum pulse width. As is well known, setup time generally refers to a minimal time duration a signal of interest (e.g., input signal as the constrained signal) is to reach a desired signal level ahead of a reference signal (constraining signal). Hold time refers to a minimum duration of time the signal of interest is to stay at the desired level after an edge of a clock signal, for example, to enable proper sampling. Pulse width refers to a minimum pulse duration the reference/constraining signal (e.g. clock signal) needs to stay at a desired signal level for a signal of interest to be sampled accurately by a sequential component.

Constraint values generally depend on specific combination of circuit parameters associated with an integrated circuit. Examples of circuit parameters include the slew rates of the clock and the data signals. As is well known, the slew of a signal represents the rate of change of signal level when the signal transitions from one logical value to the other. In general, slew is measured based on an amount of time taken for the signal to change from a level substantially representing one logical value to another level representing the other logical value.

Circuit parameters may include (or be affected by) other factors such as manufacturing process, temperature and voltage, which generally impact the electrical characteristics of integrated circuits. Accordingly, the value of constraint parameters can be affected by such parameters as well. Thus, a constraint parameter may take one value at one combination of circuit parameters and another value at another combination of circuit parameters.

The correct value of a constraint parameter (for a specific combination of circuit parameters) is often determined by searching within a search range (of the constraint parameter). In an approach referred to as a binary search well known in the relevant arts, a value in the middle of the search range is assumed for the constraint parameter, and an input signal is provided to the component simulated using tools such as SPICE also well known in the relevant arts. The search range for the next iteration is set to either the upper half or a lower half (of the search range for the previous iteration) depending on the result of simulation. Such an approach is continued iteratively until the correct value (within acceptable error) of the constraint parameter is determined.

It is often desirable to measure the correct value of constraint parameters at different combinations of circuit parameters. For example, a cell library may contain designs corresponding to several components (e.g., flip-flops, latches), and it may be desirable to compute the constraint values of the components for different combinations of circuit parameters. The values thus computed may be stored associated with the corresponding components in the cell libraries. When an integrated circuit is designed later, a designer (or tool assisting with the design) may make appropriate design decisions quickly based on the available values, irrespective of the combination of circuit parameters at which the circuit is being designed.

It may thus be appreciated that the number of constraint values to be measured can be substantially high with the number of elements/variables in the circuit parameters, the number of possible values for each specification element, etc. At least due to such a high number of constraint values to be computed, substantial amount of time (or computational resources) may be required to determine the constraint values of interest. It may thus be desirable to reduce time to measure constraint parameters at different combinations of specifications.

SUMMARY OF THE INVENTION

An aspect of the present invention enables the measurement of a constraint parameter of a component for a combination of circuit parameters according to which an integrated circuit is implemented. In an embodiment, the value of the constraint parameter for a given combination of circuit parameters is estimated based on the constraint values corresponding to other combinations of the circuit parameters. The estimated value is then used to search for the correct value of the constraint parameter for the given combination.

As the estimation may be accurate, the correct value can be determined by searching in a narrow range, thereby reducing time to measure constraint parameters for several combinations of the circuit parameters. In an embodiment, the constraint parameters are measured for a flip-flop, and the circuit parameters contain slew rates of a data signal and a clock signal.

In an embodiment, the search is implemented by performing a first simulation of the component using the estimated value, and determining whether the first simulation returns a pass result. If the first simulation returns the pass result, a first search range is set with a higher end equaling the estimated value and a lower end equaling (the estimated value less a first value). If the first simulation does not return the pass result, the first search range is set with the lower end equaling the estimated value and the higher end equaling (the estimated value plus a second value).

In general, in each subsequent iteration, the higher end of the search range is set to the search point (search value) if the simulation result is a pass, and the lower end of the search range is set to the search point otherwise. In addition, if at least one instance of pass and fail (i.e., not pass) results are not already encountered, the lower end is decreased in case of pass result and the higher end is increased in the case of fail result. The extent of increase and decrease may be progressively increased during each iteration.

Thus, simulations may be continued until a third search range is determined, with the higher end of the third search range returning the pass result and the lower end not returning the pass result. In one embodiment, a binary search is performed in the third search range to determine the correct value for the constraint parameter.

In an alternative embodiment, a curve (delay as a function of constraint parameter values) is generated based on the previous simulations (with at least one pass result and one fail result). Multiple intermediate points are selected in the third search range. An expected delay is determined associated with each intermediate point using the curve. Each expected delay is compared with a threshold to determine whether the expected delay is acceptable or unacceptable. An expected delay is deemed acceptable if the expected delay is less than the threshold and unacceptable otherwise.

A next point of simulation is determined based on the results of comparison. For example, two intermediate points at 1/3 and 2/3 of the third search range may be selected. If both results are unacceptable the 2/3 point may be selected as the next point, and the 1/3 point is selected if both the results are acceptable. A middle point in the search range is selected if one of the results is acceptable and another is unacceptable. By using such an approach, the search range maybe reduced to 1/3 instead of 1/2 in the case of a binary search. Due to the reduction, the number of searches may be also reduced.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the following accompanying drawings.

FIG. 5 is shown containing a matrix representing the manner in which each of the constraint parameters may be determined in an embodiment of the present invention.

DETAILED DESCRIPTION OF THE PREFERRED EMBODIMENTS

1. Overview

An aspect of the present invention reduces the time to measure a constraint parameter for a specific combination of circuit parameters by first generating an estimate of the constraint parameter based on any previously computed values for different combinations of the circuit parameters. The estimate may be fairly accurate due to the use of previously computed values, and the search for the correct value may be performed in a fairly narrow range due to such estimation. Due to the search in the narrow range, the constraint value for the specific combination may be measured quickly. The aggregate time to measure constraint parameters for various combinations of circuit parameters may thus be reduced.

Several aspects of the invention are described below with reference to example environments for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Computer System

Figure 1:
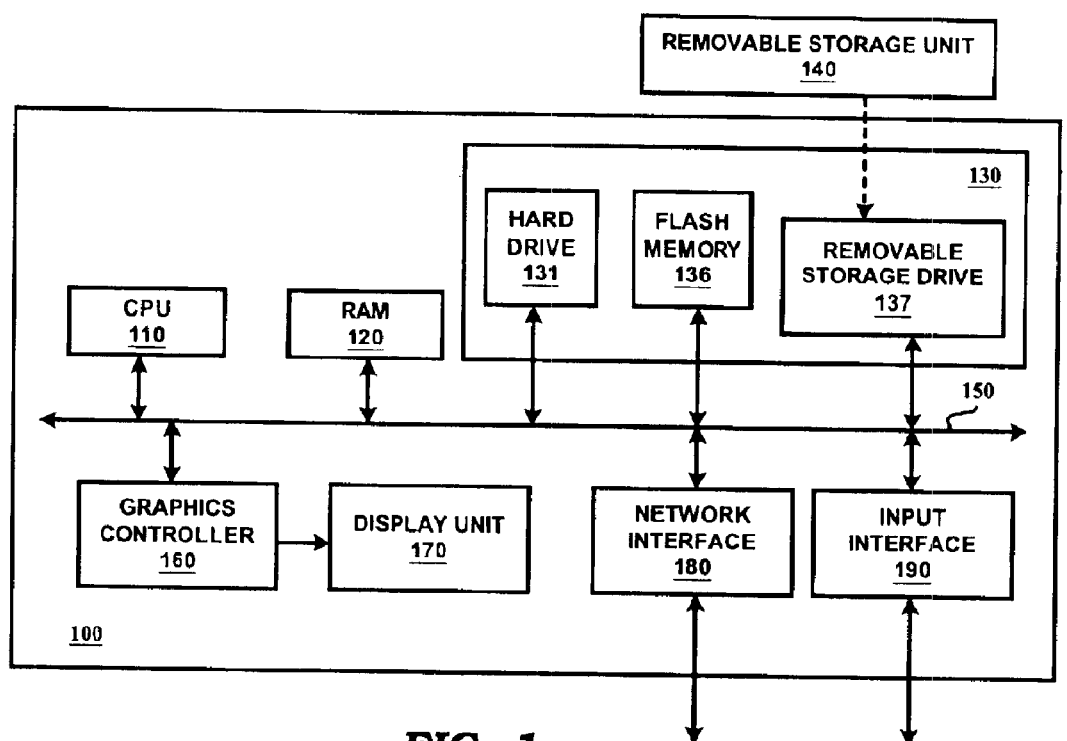
FIG. 1 is a block diagram of a computer system implemented according to an aspect of present invention.

FIG. 1 is a block diagram of computer system 100 illustrating an example system for implementing the present invention. Computer system 100 may contain one or more processors such as central processing unit (CPU) 110, random access memory (RAM) 120, secondary memory 130, graphics controller 160, display unit 170, network interface 180, and input interface 190. All the components except display unit 170 may communicate with each other over communication path 150, which may contain several buses as is well known in the relevant arts. The components of FIG. 1 are described be low in further detail.

CPU 110 may execute instructions stored in RAM 120 to provide several features of the present invention. CPU 110 may contain multiple processing units, with each processing unit potentially being designed for a specific task. Alternatively, CPU 110 may contain only a single processing unit. RAM 120 may receive instructions from secondary memory 130 using communication path 150. Data representing various cells (in libraries) and the determined constraint values may be stored and retrieved from secondary memory 130 (and/or RAM 120) during the execution of the instructions.

Graphics controller 160 generates display signals (e.g., in RGB format) to display unit 170 based on data/instructions received from CPU 110. Display unit 170 contains a display screen to display the images defined by the display signals. Input interface 190 may correspond to a key-board and/or mouse, and generally enables a user to provide inputs. Network interface 180 enables some of the inputs (and outputs) to be provided on a network. In general, display unit 170, input interface 190 and network interface 180 enable a user to design integrated circuits using cell libraries provided in secondary memory 130 (or received from network interface 180), and may be implemented in a known way.

Secondary memory 130 may contain hard drive 131, flash memory 136 and removable storage drive 137. Secondary storage 130 may store the software instructions and data (e.g., cell libraries and determined constraint values), which enable computer system 100 to provide several features in accordance with the present invention. Some or all of the data and instructions may be provided on removable storage unit 140, and the data and instructions may be read and provided by removable storage drive 137 to CPU 110. Floppy drive, magnetic tape drive, CD-ROM drive, DVD Drive, Flash memory, removable memory chip (PCMCIA Card, EPROM) are examples of such removable storage drive 137.

Removable storage unit 140 may be implemented using medium and storage format compatible with removable storage drive 137 such that removable storage drive 137 can read the data and instructions. Thus, removable storage unit 140 includes a computer readable storage medium having stored therein computer software and/or data. An embodiment of the present invention is implemented using software running (that is, executing) in computer system 100.

In this document, the term "computer program product" is used to generally refer to removable storage unit 140 or hard disk installed in hard drive 131. These computer program products are means for providing software to computer system 100. As noted above, CPU 110 may retrieve the software instructions, and execute the instructions to provide various features of the present invention. The features of the present invention are described below in detail. For illustration, the features are described with reference to a D flip-flop.

3. Example Component

Figure 2:
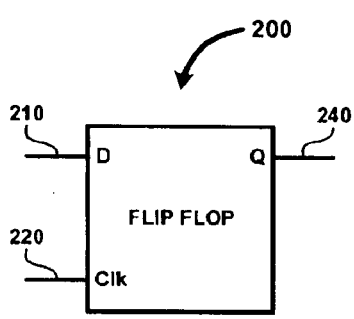
FIG. 2 is a block diagram of a D flip-flop illustrating the details of an example component.

FIG. 2 is a block diagram of D flip-flop 200 illustrating an example component, the constraint parameters of which can be measured according to an aspect of the present invention. D flip-flop 200 is shown receiving D-input 210 and clk-input 220, and generating Q-output 240 in response.

D flip-flop 200 transfers the signal received on D-input 210 to Q-output when clk-input 220 transitions from a logical low to high. Thus, the signal at Q-output on path 240 may be similar to the signal at D-input but appears after certain delay. D flip-flop 200 may be characterized by three constraint parameters—setup time, hold time and pulse width. The constraint parameter values may depend on the specific values associated with the circuit parameters.

The manner in which the setup time of D flip-flop 200 can be determined for various combinations of slew times (of data signal and clock signal) is described below. However, the approaches can be applied to other components, constraint parameters and circuit parameters, as will be apparent to one skilled in the relevant arts. Such applications are contemplated to be within the scope and spirit of various aspects of the present invention.

4. Method

Figure 3:
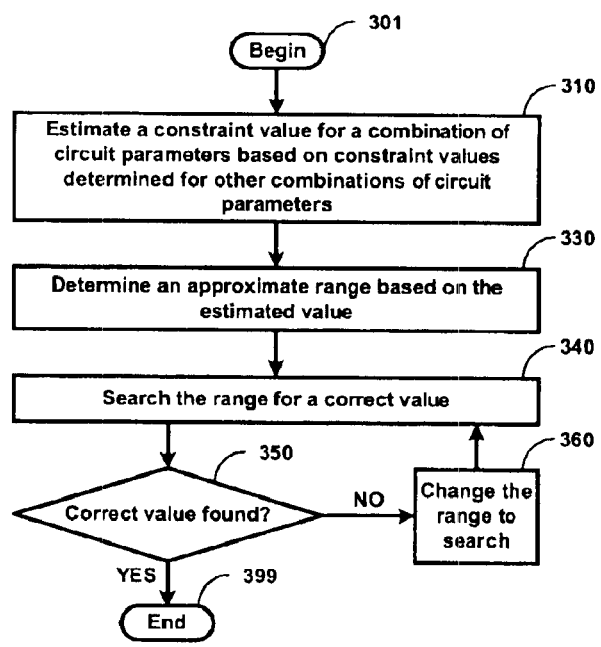
FIG. 3 is a flowchart illustrating the manner in which constraint parameter values for various combinations of circuit parameters may be determined quickly according to an aspect of present invention.

FIG. 3 is a flowchart illustrating the manner in which constraint parameter values for various combinations of circuit parameters may be determined quickly according to an aspect of present invention. For illustration, the method is described with reference to FIGS. 1 and 2. However, the method can be implemented in several other embodiments to determine the constraint parameter of other components as will be apparent to one skilled in the relevant arts based on the disclosure provided herein. The method begins in step 301 in which control passes to step 310.

In step 310, computer system 100 estimates a constraint value for a combination of circuit parameters based on constraint values determined for other combinations of circuit parameters. Various approaches may be employed for such an estimation. An example approach is described in sections below in further detail.

In step 330, an approximate range may be determined based on the estimated value. In general, the range needs to include some values which are greater than the estimated value and some values which are less than the estimated value.

In step 340, computer system 100 performs a search in the range determined in step 330 for the correct value. Searching generally entails using a specific value for the constraint parameter(sought to be measured), and determining whether the component is functional with that specific value. The specific value is changed iteratively until the correct value (within acceptable error limits) is determined. An example search approach is described below in further detail.

In step 350, computer system 100 determines whether a correct value was found (determined) or not in step 340. If a correct value is found, control is transferred to step 399, otherwise control is transferred to step 360. In step 360, the range in which search is to be performed, is changed and control is transferred to step 340. Thus, the loop of steps 340, 350 and 360 is continued until a correct value (for the constraint parameter) is found. The method ends in step 399.

The steps of FIG. 3 are illustrated with additional examples below. In an embodiment, the estimation of step 310 is performed by using curve fitting technique. The principle underlying curve fitting technique is described below with reference to FIG. 4.

5. Principle

Figure 4:
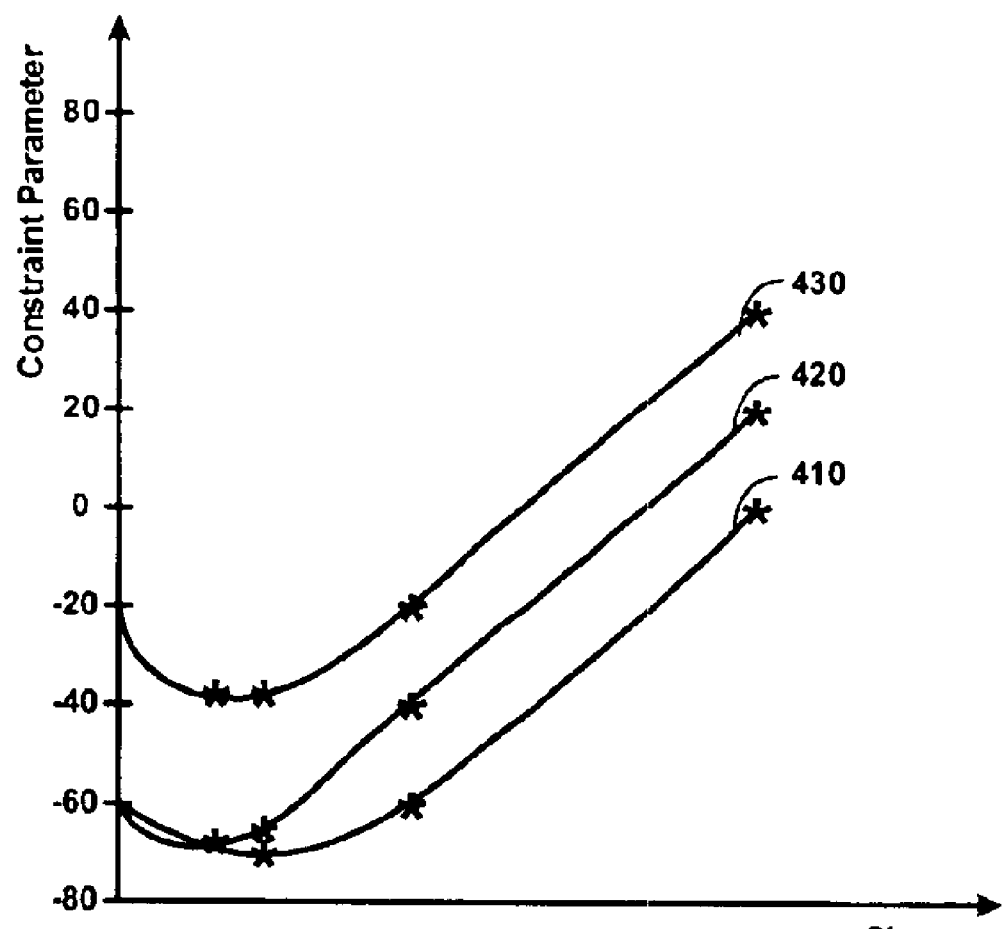
FIG. 4 is a graph illustrating the variation of constraint value with variation in data slew, which can be used to determine the constraint parameters according to an aspect of present invention.

FIG. 4 is a graph illustrating the variation of constraint value with variations in slews. It should be appreciated that the graph is based on various data points that are sought to be determined according to various aspects of the present invention. However, examination of the accurate values provides an appreciation of the principle used in an embodiment of the present invention.

The graph contains data slew (i.e., slew of the data signal) along x-axis and constraint values along y-axis. Three curves 410, 420 and 430 are shown corresponding to three values of clock slew (i.e., slew of the clock signal). Thus, it may be appreciated that each curve is drawn keeping the clock slew constant. However, similar (curve) pattern may be observed by keeping the data slew constant and varying the clock slew.

From FIG. 4, it may be appreciated that the constraint values fall in the pattern of a curve, which can be modeled using various mathematical expressions. In an embodiment, a 2-D spline curve is used to determine the pattern and thus estimate the next value (as in step 310 of FIG. 3). However, in some cases, prior values may not be present, and in such cases estimation as in step 310 may not be possible. The manner in which the constraint values may be determined using the approach(es) above is described below with reference to FIG. 5.

6. Matrix

FIG. 5 is shown containing a matrix representing the manner in which each of the constraint parameters may be determined in an embodiment of the present invention. The matrix is shown containing 5 rows 510, 520, 540, 560 and 580, and 6 columns 501, 502, 504, 506, 508 and 509, resulting in 30 entries. Even though the description is provided with reference to a matrix containing only two dimensions, it should be appreciated that the concepts can easily be extended to multiple dimensions (manufacturing process, temperature, voltage, etc.) without departing from the scope and spirit of various aspects of the present invention.

The entries along the row correspond to a particular value of clock slew with changing data slews, and entries along the column correspond to a particular value of data slew with changing clock slews. Accordingly, entries ((1,1), (1,2), (1,3), (1,4), (1,5) and (1,6)) in row 510 represents values corresponding to a first value of clock slew and changing the data slew. The entries ((1,1), (2,1), (3,1), (4,1), and (5,1)) in column 501 represent values corresponding to a first value of data slew and changing the clock slew.

The manner in which each entry can be determined is described now. It may be helpful to appreciate that the values are described as being determined in a row major order from left to right, starting from the left-lower corner in FIG. 5. Thus, in row 510, entry (1,1) (at left lower corner) contains 'none', indicating that the value in the entry may need to be determined independently (without the benefit of any prior values). Thus, the constraint value corresponding to entry (1, 1) may be determined by a prior approach (e.g., binary search).

Entry (1,2) contains PLC (prediction using last constraint value), which indicates that the constraint value corresponding to entry (1,2) is determined from the value predicted (estimated) based on the previous slew (represented by entry (1,1)). PLC is used when only one previous entry is available for determining the correct value of the next entry. Similarly, entry (2, 1) also contains PLC.

Entry (1,3) contains PDS (prediction using curve fitting across data slews), which indicates that the constraint value corresponding to entry (1, 3) is estimated based on previously determined correct values in the same row (i.e., correct values corresponding to (1,1)and (1,2)). Similarly, correct values of the other entries with PDS may be estimated using previously computed correct values corresponding to entries in the same row. The correct values may then be determined by searching around the estimated values.

In row 520, Entry (2,2) contains PPC (prediction using parallel curves), which indicates that the constraint value corresponding to entry (2,2) is determined assuming that the curves corresponding to rows 510 and 520 are parallel. Thus, the difference of actual values corresponding to entries (1, 1) and (1, 2) may be determined, and the same difference is used in relation to actual value corresponding to entry (2, 1) to estimate the value for entry (2, 2).

In row 540, entry (3,1) contains PCS (prediction using curve fitting across clock slew) which indicates that the constraint value corresponding to entry (3,1) is determined from the value estimated based on the previously determined correct values in the same column (i.e., correct values corresponding to (1,1) and (2,1)). Similarly, values of the other entries with PCS may be estimated using previously computed values corresponding to entries in the same column.

From the above, it may be appreciated that constraint values for several combinations of circuit parameters may be estimated based on previously computed correct values. The manner in which the correct value can be determined from an estimated value is described with additional examples below.

7. Determining Correct Value From an Estimated Value

Figure 6:
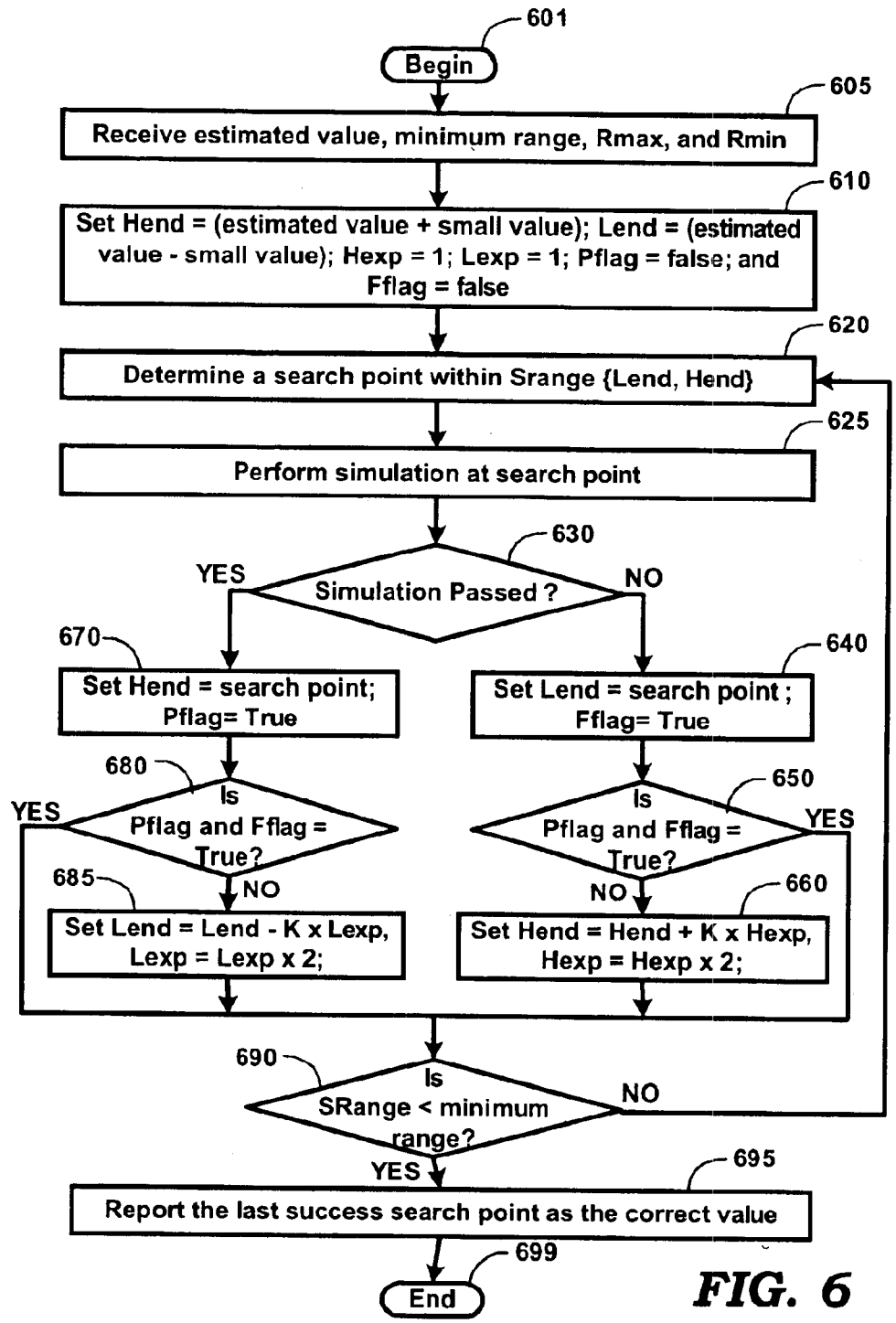
FIG. 6 is a flowchart illustrating the manner in which correct values may be determined from estimated values quickly according to an aspect of present invention.

FIG. 6 is a flowchart illustrating the manner in which correct values may be determined from estimated values in an embodiment of the present invention. The method begins in step 601 and control immediately passes to 605.

In step 605, computer system 100 receives estimated value, minimum range, Rmax, and Rmin. Rmax and Rmin respectively represent the maximum and minimum values the constraint value can potentially have, and may be provided by the designer of the component. Minimum range specifies the acceptable error in computation of the correct value for a constraint parameter.

In step 610, variables Hend and Lend are respectively set equal to (estimated value+small value) and (estimated value−small value). In an embodiment, 'small value' is chosen equal to zero. As described below, the variable Lend represents the lower (left) end of a (present) search range and the variable Hend represents the higher (right) end of the search range.

Variables Hexp and Lexp are both set equal to 1. The variables Hexp and Lexp are used to accelerate the increase of the range in right and left directions if successive fail and pass results are obtained while determining the search range in the loop of steps 620–690, as described below.

Pflag and Fflag respectively represent pass flag and fail flag, which are both initially set to false. Pflag and Fflag respectively change to and remain at true when the first case of pass and fail is encountered as described below. When both the flags are true, the search range is deemed to be accurately determined by the loop of steps 620–690.

In step 620, a next search point is determined. The determination can be performed using various approaches. In an embodiment, when at least one of Pflag and Fflag is false, the search point is selected to equal the average of Hend and Lend. On the other hand, when both Pflag and Fflag are true, the manner in which search point may be determined is described below with reference to FIG. 7.

In step 625, simulation is performed at the search point (determined in step 620), that is, the component is simulated assuming a constraint value equaling the search point. Tools such as SPICE simulators, well known in the relevant arts, may be used for the simulation.

In step 630, a determination is made as to whether the simulation of step 625 has passed (or is successful). In an embodiment, the result is determined to be a pass if the component is functional (i.e., data propagated in the case of flip flop 200) and if the propagation delay corresponding to search point is lesser than Rdelay (the measurement of which is described in sections below). The result is determined to be a fail otherwise. Control is transferred to step 640 if the result is deemed as fail, and to step 670 otherwise.

In step 640, the variable Lend is set equal to search point, and Fflag is set to True reflecting that a simulation fail situation is already encountered. In step 650, status of Pflag and Fflag is examined to determine whether both the flags are equal to 'True'. If both Pflag and Fflag are equal to 'True', control is transferred to step 690, otherwise to step 660.

In step 660, Hend is set equal to {Hend+K×Hexp}, and Hexp is set equal to Hexp×2 ('x' indicates a multiplication factor), wherein K represents some constant value. As may be appreciated, the result of multiplying Hexp is that the rate of increase of Hend is more over successive iterations. Control is transferred to step 690. In step 670, the variable Hend is set equal to the search point, and Pflag is set equal to True, similar to the manner in which Lend and Fflag are set in step 640 above.

In step 680, status of Pflag and Fflag is examined to determine whether both the flags are equal to 'True'. If both Pflag and Fflag are equal to true, control is transferred to step 690, otherwise to step 685. In step 685, Lend is set equal to {Lend−K×Lexp}, Lexp is set equal to Lexp×2 ('x' indicates a multiplication factor). Control is then transferred to step 690.

In step 690, a determination is made as to whether SRange (equaling Hend−Lend) is less than the minimum range (received in step 605). If the SRange is less than the minimum range, control is transferred to step 695, otherwise control is transferred to step 620. In the loop of steps 620–690, appropriate steps are repeated iteratively until SRange becomes less than minimum range.

In step 695, the search point corresponding to the last pass result in step 630) is reported as the correct value of the constraint parameter. As the Hend variable contains the corresponding value, the correct value is reported using Hend, and the method ends in step 699. Thus, the correct value of a constraint parameter may be determined from the estimated value. The operation of the steps of FIG. 6 is further illustrated with reference to an example below.

8. Example

Figure 7:
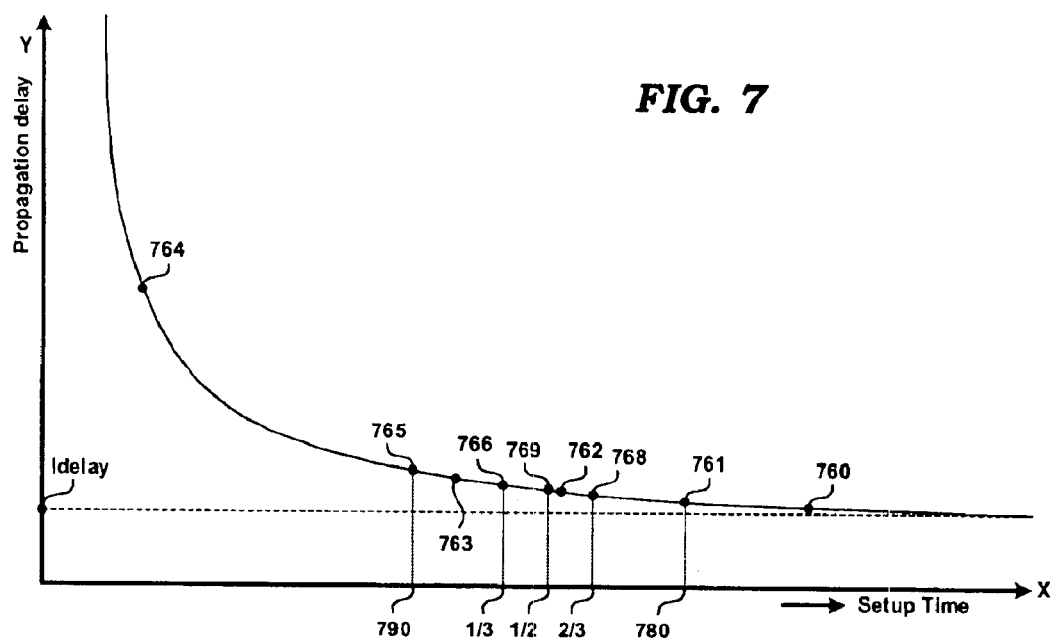
FIG. 7 is a graph illustrating the variation of propagation delay with variation in constraint values used to determine better search points according to an aspect of present invention.

FIG. 7 is a graph containing the constraint values (setup times) used for a search on X-axis and the propagation delay (i.e., between rising edge of a clock and the data showing up at Q-output) on the Y-axis. When the constraint value is lower than the minimum value permissible, the propagation delay is shown heading towards infinity, implying that the data is not propagated.

As may be observed, the propagation delay is shown increasing exponentially in one portion as the constraint value is decreased and substantially flat in another portion as the constraint value is increased. The correct constraint value is the smallest setup time at which the delay is less than Rdelay within accuracy limit (minimum range in the document), and is assumed to be at point 763 in the present illustrative example. The delay corresponding to infinite set up time (or Rmax practically) is referred to as Idelay.

Rdelay is a parameter defined as some delay higher (e.g., 10% more) than Idelay, and is used in determining the correct value as described above with reference to FIG. 6. Rmin and Rmax respectively represent minimum and maximum constraint values specifying lower and upper bound to any search ranges, and may be specified by a user. The curve of FIG. 7 is used to determine successive search points as described below.

Continuing with combined reference to FIGS. 6 and 7, for illustration, it is assumed that the estimated value corresponds to point 760. A pass result would be determined in step 630 (since search point 760 is substantially more than accurate value 763), and thus control passes to step 670. Hend is then set to the search point and Pflag is set to true. Control then passes to step 685, in which Lend is reduced by (K×Lexp), and the resulting Lend is assumed to correspond to point 762. The search range at the end of the first iteration is thus between points 762 and 760. Control then passes to step 620.

The search point for the next (second) iteration is set to the average of Lend and Hend (assumed to be point 761) as Fflag is false. A pass result would be detected in step 630 (again since search point 761 is substantially more than accurate value 763), causing Lend to be reduced by a larger factor than in the first iteration, and Lend is accordingly assumed to equal 764. Hend would be set to the search point 761. The search range at the end of the second iteration is thus between points 764 and 761. Control then passes to step 620.

The search point for the next (third) iteration is set to the average (point 765) of Lend and Hend. A fail result would now be detected in step 630 (as search point 765 is substantially less than accurate value 763), control passes to step 640. Lend is set equal to the search point (765), and Fflag is set equal to true. As both the flags are now set to true, control passes to step 690 from steps 650 and 680 in all the subsequent iterations (including the present iteration). Thus, at the end of the third iteration, the search range is between points 765 and 761.

It should be appreciated that the range defined by pass and fail points at either end, would be narrow if the constraint parameter is estimated with some level of accuracy. As a result, the number of iterations above may be minimized. Once the search range is narrow, the number of searches with that range also would be fewer, thereby leading to further reduction in the cell library characterization time. The manner in which further searching can be performed within the pass and fail points, is described below.

Figure 8:
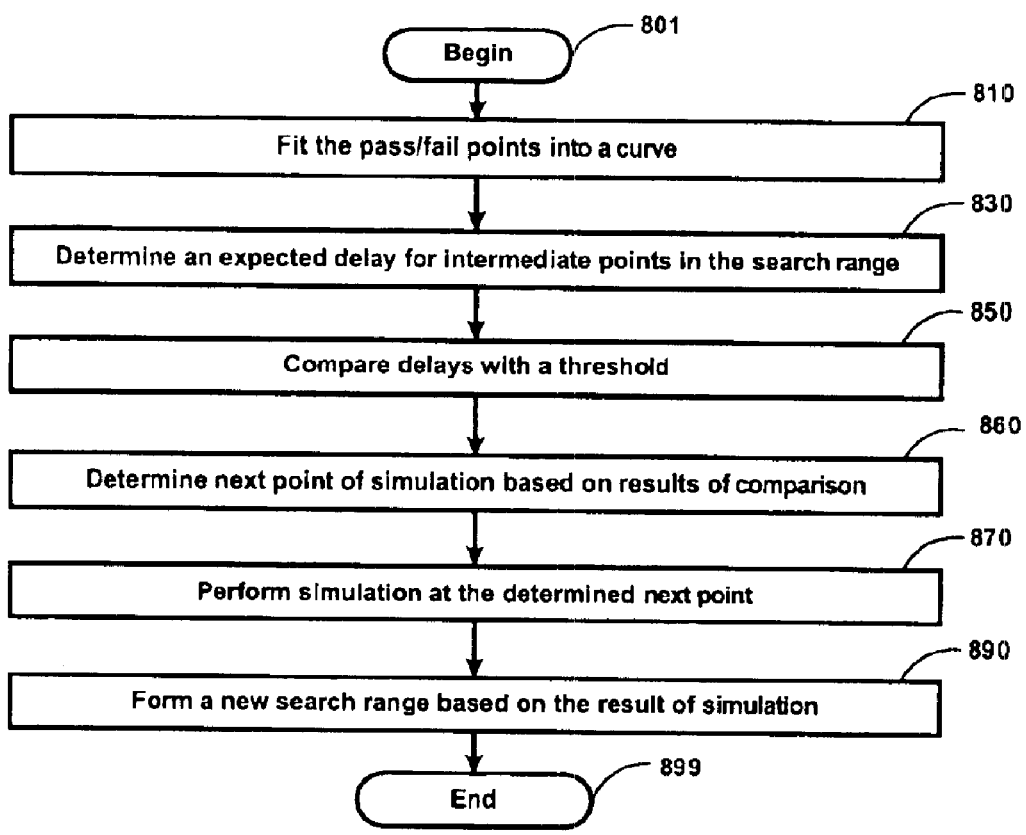
FIG. 8 is a flowchart illustrating the manner in which curve-fitting approaches can be used to reduce the number of simulations while searching in a range according to another aspect of the present invention.

In one embodiment, a binary search is performed while narrowing the search range in successive iterations until the condition of step 690 becomes true. An alternative embodiment is described below with reference to FIG. 8. The method is described with reference to the embodiments described above merely for illustration. However, the method can be implemented in other environments/embodiments as well. The method begins in step 801, in which control immediately passes to step 810.

In step 810, a curve (with delay as a function of constraint parameter value) is generated fitting the various fail and pass points. In an embodiment, the curve is represented by an equation, which can then be evaluated for various determinations. In the example of above, the curve may be fitted through points 760, 761 and 765. Various curve fitting techniques (e.g., Spline curve) well known in the relevant arts may be employed. For illustration, it is assumed that the curve of FIG. 7 is generated.

In step 830, determine an expected delay corresponding to one or more intermediate points in the search range by using the generated curve. As may be appreciated, the closest pass and fail points (in the illustrative example, points 765 and 761) form the search range. In an embodiment, the delay corresponding to two points (1/3 and 2/3 of the search range) is determined by examining the curve.

In other words, assuming that 790 and 780 respectively represent the X-coordinates for the fail and pass points of the search range, the 1/3 (point 766) and 2/3 (point 768) points in that range (780–790) are determined, and the corresponding delay on the Y-axis is determined by examining the curve.

In step 850, each of the delays determined in step 830 is compared with a threshold. In an embodiment, the threshold is set equal to Rdelay noted above. If a delay is less than the threshold, the delay is deemed to be acceptable, otherwise unacceptable.

In step 860, the next point of simulation is determined based on the results of comparison of step 850. If the results of both points 766 and 768 are deemed to be unacceptable, the next point of simulation may be set to 2/3 point 768. If the results of both points 766 and 768 are deemed to be acceptable, the next point of simulation may be set to 1/3 point 766. If result of point 768 is acceptable and if the result of point 766 is unacceptable, the next point of simulation may be set to intermediate point 769 (shown as being at the middle) in the search range.

In the illustrative example, both the points 766 and 768 are deemed to be acceptable in step 850, as delays at points 766 and 768 are smaller than threshold (Rdelay at point 763). Hence, the next simulation point is set to 1/3 point 766 in step 860.

In step 870, a simulation is performed for the next point determined in step 860. In the illustrative example, the simulation is performed at point 766 in step 870. The result of simulation is deemed to be pass as the delays determined in step 830 using curve fitting are generally accurate.

In step 890, a new search range is set based on the result of the simulation. In the illustrative example, the next search range is set to between points 765 and 766 in step 890. This search range is 1/3 of previous search range, between points 765 and 761.

Various approaches may be used to search within the range to determine the correct delay value. As may be appreciated, the approach of FIG. 8 may enable reduction in number of iterations (simulations) as the search window may be reduced to 1/3 (as opposed to half in a binary search).

Thus, using approaches such as above, the correct value of a constraint parameter can be determined. As may be appreciated, due to the use of the correct value corresponding to other combinations of the circuit parameters, the estimated value for a given combination may be accurately determined. Due to such accuracy, the number of additional searches required may be further minimized by searching around the estimated value.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of measuring a constraint parameter of a component for a combination of circuit parameters according to which an integrated circuit is implemented, said component being designed for use in said integrated circuit, said method comprising:

estimating said constraint parameter for said combination of circuit parameters based on correct constraint parameter values of one or more of other combinations of said circuit parameters to generate an estimated value; and searching around said estimated value to determine a correct value for said constraint parameter for said combination of circuit parameters.

2. The method of claim 1, wherein said circuit parameters comprise slew rates of a data signal and a clock signal.

3. The method of claim 1, wherein said searching comprises:

performing a first simulation of said component using said estimated value for said constraint parameter;

determining whether said fist simulation returns a pass result;

if said first simulation returns said pass result, setting a first search range with a higher end equaling said estimated value and a lower end equaling (said estimated value less a first value); and if said first simulation does not return said pass result setting said first search range with said lower end equaling said estimated value and said higher end equaling (said estimated value plus a second value).

4. The method of claim 3, wherein said searching further comprises:

performing a second simulation of said component using a second search value for said constraint parameter, wherein said second search value is contained in said first search range;

determining whether said second simulation returns said pass result;

if said second simulation returns said pass result, setting a second search range with a higher end equaling said second search value;

if said second simulation returns said pass result and if said first simulation also returned said pass result, setting a lower end of said second search range to equal (said lower end of said first search range less a third value), wherein said third value is more than said first value;

if said second simulation does not return said pass result, setting said lower end of second search range to equal said second search value; and if said second simulation does not return said pass result and if said first simulation did not return said pass result, setting said higher end of said second search range to equal (said higher end of said first search range plus a fourth value), wherein said fourth value is more than said second value.

5. The method of claim 4, further comprising determining a third search range with said higher end of said third search range returning said pass result and said lower end not returning said pass result.

6. The method of claim 5, further comprising performing a binary search in said third search range to determine said correct value of said constraint parameter.

7. The method of claim 5, further comprising:

generating a curve with delay as a function of constraint parameter values, wherein said curve is generated based on at least said first simulation and said second simulation;

selecting a plurality of intermediate points in said third search range;

determining an expected delay associated with each of said plurality of intermediate points using said curve;

comparing said each expected delay with a threshold to determine whether said expected delay is acceptable or unacceptable, wherein said expected delay is deemed acceptable if said expected delay is less than said threshold and unacceptable otherwise; and determining a next point of simulation based on the results of said comparing.

8. The method of claim 7, wherein said plurality of intermediate points comprise a 1/3 point and a 2/3 point in said third search range.

9. The method of claim 8, wherein said next point comprises said 2/3 point if the results of said comparing are both deemed to be unacceptable, wherein said next point comprises said 1/3 point if the results of comparing of both are deemed to be acceptable, wherein said next point comprises an intermediate point in said third search range otherwise.

10. The method of claim 7, further comprising:

performing a third simulation using a parameter value corresponding to said next point; and setting a fourth search range based on a result of said third simulation.

11. The method of claim 5, wherein said component comprises a flip-flop.

12. The method of claim 11, wherein said pass result is returned if said component is functional for the corresponding search point and if a delay from an input to an output of said flip-flop is within a threshold.

13. A method of searching for a correct value of a constraint parameter of a component based on a plurality of points, wherein said plurality of points contain a first pass point and a first fail point, wherein said correct value is contained in a first search range defined by said first pass point and said first fail point, wherein each of said plurality of points is associated with a corresponding one of a plurality of values of said constraint parameter, said method comprising:

generating a curve with delay as a function of said plurality of points;

selecting a plurality of intermediate points in said first search range;

determining an expected delay associated with each of said plurality of intermediate points using said curve;

comparing said each expected delay with a threshold to determine whether said expected delay is acceptable or unacceptable, wherein said expected delay is deemed acceptable if said expected delay is less than said threshold and unacceptable otherwise; and determining a next point of simulation based on the results of said comparing.

14. The method of claim 13, wherein said plurality of intermediate points comprise a 1/3 point and a 2/3 point in said first search range.

15. The method of claim 14, wherein said next point comprises said 2/3 point if the results of said comparing are both deemed to be unacceptable, wherein said next point comprises said 1/3 point if the results of comparing of both are deemed to be acceptable, wherein said next point comprises an intermediate point in said first search range otherwise.

16. The method of claim 13, further comprising:

performing a simulation using a parameter value corresponding to said next point; and setting a fourth search range based on a result of said simulation.

17. The method of claim 13, wherein said curve is represented in the form of an equation.

18. A system for measuring a constraint parameter of a component for a combination of circuit parameters according to which an integrated circuit is implemented, said component being designed for use in said integrated circuit, said system comprising:

means for estimating said constraint parameter for said combination of circuit parameters based on correct constraint parameter values of one or more of other combinations of said circuit parameters to generate an estimated value; and means for searching around said estimated value to determine a correct value for said constraint parameter for said combination of circuit parameters.

19. The system of claim 18, wherein said circuit parameters comprise slew rates of a data signal and a clock signal.

20. The system of claim 19, wherein said searching comprises:

means for performing a first simulation of said component using said estimated value for said constraint parameter;

means for determining whether said first simulation returns a pass result;

means for setting a first search range with a higher end equaling said estimated value and a lower end equaling (said estimated value less a first value) if said first simulation returns said pass result; and means for setting said first search range with said lower end equaling said estimated value and said higher end equaling (said estimated value plus a second value) if said first simulation does not return said pass result.

21. A machine readable medium carrying one or more sequences of instructions for causing a system to measure a constraint parameter of a component for a combination of circuit parameters according to which an integrated circuit is implemented, said component being designed for use in said integrated circuit, wherein execution of said one or more sequences of instructions by one or more processors contained in said system causes said one or more processors to perform the actions of:

estimating said constraint parameter for said combination of circuit parameters based on correct constraint parameter values of one or more of other combinations of said circuit parameters to generate an estimated value; and searching around said estimated value to determine a correct value for said constraint parameter for said combination of circuit parameters.

22. The machine readable medium of claim 21, wherein said circuit parameters comprise slew rates of a data signal and a clock signal.

23. The machine readable medium of claim 21, wherein said searching comprises:

performing a first simulation of said component using said estimated value for said constraint parameter;

determining whether said first simulation returns a pass result;

if said first simulation returns said pass result, setting a first search range with a higher end equaling said estimated value and a lower end equaling (said estimated value less a first value); and if said first simulation does not return said pass result, setting said first search range with said lower end equaling said estimated value and said higher end equaling (said estimated value plus a second value).

24. The machine readable medium of claim 23, wherein said searching further comprises:

performing a second simulation of said component using a second search value for said constraint parameter, wherein said second search value is contained in said first search range;

determining whether said second simulation returns said pass result;

if said second simulation returns said pass result, setting a second search range with a higher end equaling said second search value;

if said second simulation returns said pass result and if said first simulation also returned said pass result, setting a lower end of said second search range to equal (said lower end of said first search range less a third value), wherein said third value is more than said first value;

if said second simulation does not return said pass result, setting said lower end of second search range to equal said second search value; and if said second simulation does not return said pass result and if said first simulation also did not return said pass result, setting said higher end of said second search range to equal (said higher end of said first search range plus a fourth value), wherein said fourth value is more than said second value.

25. The machine readable medium of claim 24, further comprising determining a third search range with said higher end of said third search range returning said pass result and said lower end not returning said pass result.

26. The machine readable medium of claim 25, further comprising performing a binary search in said third search range to determine said correct value of said constraint parameter.

27. The machine readable medium of claim 25, further comprising:

generating a curve with delay as a function of constraint parameter values, wherein said curve is generated based on at least said first simulation and said second simulation;

selecting a plurality of intermediate points in said third search range;

determining an expected delay associated with each of said plurality of intermediate points using said curve;

comparing said each expected delay with a threshold to determine whether said expected delay is acceptable or unacceptable, wherein said expected delay is deemed acceptable if said expected delay is less than said threshold and unacceptable otherwise; and determining a next point of simulation based on the results of said comparing.

28. The machine readable medium of claim 25, wherein said component comprises a flip-flop, and wherein said pass result is returned if said component is functional for the corresponding search point and if a delay from an input to an output of said flip-flop is within a threshold.

29. A machine readable medium carrying one or more sequences of instructions for causing a system to search for a correct value of a constraint parameter of a component based on a plurality of points, wherein said plurality of points contain a first pass point and a first fail point, wherein said correct value is contained in a first search range defined by said first pass point and said first fail point, wherein each of said plurality of points is associated with a corresponding one of a plurality of values of said constraint parameter, wherein execution of said one or more sequences of instructions by one or more processors contained in said system causes said one or more processors to perform the actions of:

generating a curve with delay as a function of said plurality of points;

selecting a plurality of intermediate points in said first search range;

determining an expected delay associated with each of said plurality of intermediate points using said curve;

comparing said each expected delay with a threshold to determine whether said expected delay is acceptable or unacceptable, wherein said expected delay is deemed acceptable if said expected delay is less than said threshold and unacceptable otherwise; and determining a next point of simulation based on the results of said comparing.

30. The computer readable medium of claim 29, further comprising:

performing a simulation using a parameter value corresponding to said next point; and setting a fourth search range based on a result of said simulation.

31. A system for searching for a correct value of a constraint parameter of a component based on a plurality of points, wherein said plurality of points contain a first pass point and a first fail point, wherein said correct value is contained in a first search range defined by said first pass point and said first fail point, wherein each of said plurality of points is associated with a corresponding one of a plurality of values of said constraint parameter, said system comprising:

means for generating a curve with delay as a function of said plurality of values;

means for selecting a plurality of intermediate points in said first search range;

means for determining an expected delay associated with each of said plurality of intermediate points using said curve;

means for comparing said each expected delay with a threshold to determine whether said expected delay is acceptable or unacceptable, wherein said expected delay is deemed acceptable if said expected delay is less than said threshold and unacceptable otherwise; and means for determining a next point of simulation based on the results of said comparing.

32. The system of claim 31, further comprising:

means for performing a simulation using a parameter value corresponding to said next point; and means for setting a fourth search range based on a result of said simulation.

* * * * *